(12) United States Patent
Ushikubo et al.

(10) Patent No.: US 12,376,470 B2
(45) Date of Patent: Jul. 29, 2025

(54) DISPLAY DEVICE

(71) Applicant: Japan Display Inc., Tokyo (JP)

(72) Inventors: Takahiro Ushikubo, Tokyo (JP); Daisuke Nemoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 461 days.

(21) Appl. No.: 17/990,020

(22) Filed: Nov. 18, 2022

(65) Prior Publication Data

US 2023/0165101 A1  May 25, 2023

(30) Foreign Application Priority Data

Nov. 25, 2021 (JP) ................. 2021-191568

(51) Int. Cl.
*H10K 59/35* (2023.01)
*H10K 59/122* (2023.01)

(52) U.S. Cl.
CPC ................ *H10K 59/353* (2023.02)

(58) Field of Classification Search
CPC ... H10K 59/353; H10K 59/352; H10K 59/122
See application file for complete search history.

(56) References Cited

U.S. PATENT DOCUMENTS

2010/0181559 A1* 7/2010 Nakatani ............ H10K 59/122
                                                    438/34
2023/0052793 A1* 2/2023 Choi ..................... H01L 24/05

FOREIGN PATENT DOCUMENTS

JP           2011-009169 A        1/2011

* cited by examiner

*Primary Examiner* — Joseph L Williams
(74) *Attorney, Agent, or Firm* — Maier & Maier, PLLC

(57) ABSTRACT

A display device incudes a first pixel electrode, a second pixel electrode, an insulating layer covering the first pixel electrode and the second pixel electrode, the insulating layer including a first opening part and a second opening part, a first light-emitting layer, a second light-emitting layer, a counter electrode arranged above the first light-emitting layer and the second light-emitting layer, wherein a light emission start voltage of the second light-emitting layer is lower than a light emission start voltage of the first light-emitting layer, the second light-emitting layer includes a first area arranged at a first end portion adjacent to the first light-emitting layer, the first area having a first dopant concentration, and a second area arranged at a second end portion of the second light-emitting layer opposing the first end portion, the second area having a second dopant concentration higher than the first dopant concentration.

7 Claims, 17 Drawing Sheets

DISPLAY DEVICE

CROSS-REFERENCE TO RELATED APPLICATIONS

This application claims the benefit of priority to Japanese Patent Application No. 2021-191568, filed on Nov. 25, 2021, the entire contents of which are incorporated herein by reference.

FIELD

An embodiment of the present invention relates to a display device and a method for manufacturing the same.

BACKGROUND

Conventionally, an organic EL display device (Organic Electroluminescence Display) using an organic electroluminescent material (organic EL material) as a light-emitting element (organic EL element) of a display unit has been known as a display device. In recent years, there has been an increasing demand for higher definition in an organic EL display device.

As the definition of the EL display device is increased, Adjacent pixels become closer together, and therefore, an effect of a leakage current flowing between adjacent pixels (hereinafter, also referred to as "leakage current in the transverse direction") is actualized. In the EL display device, the leakage current in the transverse direction may cause the adjacent pixels to emit light, thereby deteriorating the quality of the EL display device. For example, see Japanese laid-open patent publication No. 2011-009169.

SUMMARY

A display device includes a first pixel electrode, a second pixel electrode arranged separately from the first pixel electrode in a first direction, an insulating layer covering the first pixel electrode and the second pixel electrode, the insulating layer including a first opening part and a second opening part, the first opening part exposing at least a part of an upper surface of the first pixel electrode, and the second opening part exposing at least a part of an upper surface of the second pixel electrode, a first light-emitting layer arranged at a position overlapping the first pixel electrode, a second light-emitting layer arranged at a position overlapping the second pixel electrode, and a counter electrode arranged above the first light-emitting layer and the second light-emitting layer, and a light emission start voltage of the second light-emitting layer is lower than a light emission start voltage of the first light-emitting layer, the second light-emitting layer includes a first area arranged at a first end portion adjacent to the first light-emitting layer, the first area having a first dopant concentration, and a second area arranged at a second end portion of the second light-emitting layer opposing to the first end portion, the second area having a second dopant concentration higher than the first dopant concentration.

DESCRIPTION OF EMBODIMENTS

The present invention provides a display device in which a leakage current in a transverse direction in a light-emitting element is suppressed.

Hereinafter, embodiments of the present invention will be described with reference to the drawings and the like. However, the present invention can be implemented in various aspects without departing from the gist thereof and is not to be construed as being limited to the description of the embodiments exemplified below. In addition, in order to make the description clearer with respect to the drawings, the width, thickness, shape, and the like of each part may be schematically represented in comparison with actual embodiments, but the schematic drawings are merely examples, and do not limit the interpretation of the present invention. Further, in this specification and the drawings, the same or similar elements as those described with respect to the above-described drawings are indicated by the same symbols, and a redundant description may be omitted.

In the present invention, when a single film is processed to form a plurality of films, the plurality of films may have different functions and roles. However, the plurality of films derive from films formed as the same layer in the same process, and they have the same layer structure and the same material. Therefore, the plurality of films is defined as existing in the same layer.

Also, in this specification, expressions such as "upper" and "lower" in describing the drawings represent relative positional relationships between a structure of interest and other structures. In this specification, in a side view, the direction from an insulating surface to a light-emitting element, which will be described later, is defined as "upper", and a reverse direction thereof is defined as "lower". In this specification and the claims, the expression "on" in describing the manner of arranging another structure on a certain structure shall include both arranging another structure directly above a certain structure and arranging another structure above a certain structure via yet another structure, unless otherwise specified.

Figure 1:
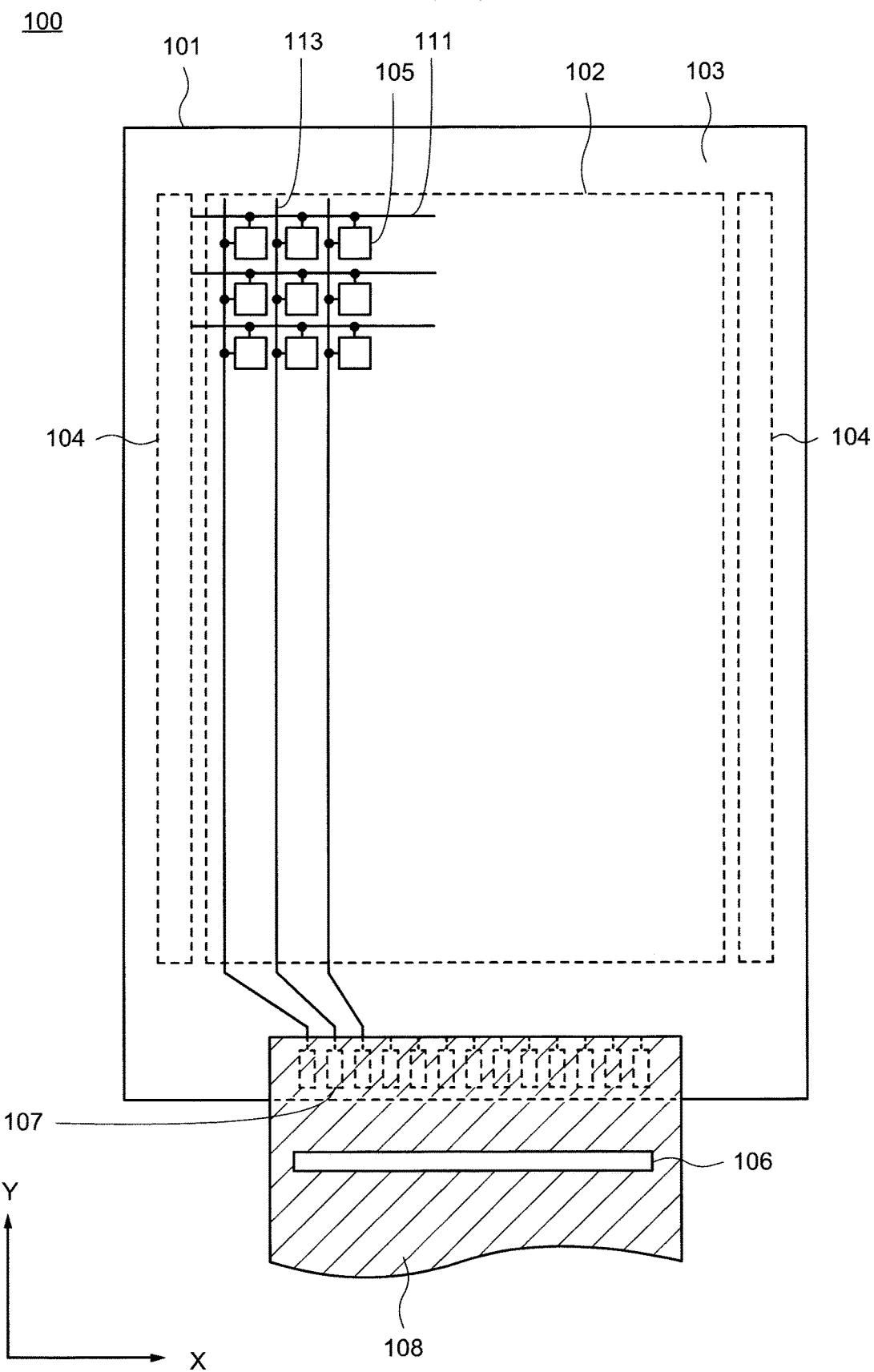
FIG. 1 is a schematic diagram when a display device according to an embodiment of the present invention is in a plan view.

A display device according to an embodiment of the present invention will be described referring to FIG. 1 to FIG. 9. FIG. 1 is a schematic diagram showing a configuration of a display device 100 according to an embodiment of the present invention and shows a schematic configuration when the display device 100 is in a plan view. In this specification, a state in which the display device 100 is viewed perpendicularly to a screen (display area) is referred to as a "plan view."

As shown in FIG. 1, the display device 100 includes a display area 102 formed in an insulating surface, a scan line drive circuit 104, a driver IC 106, and a terminal part in which a plurality of terminals 107 is arranged. A light-emitting element having an organic layer composed of an organic material is arranged in the display area 102. In addition, a peripheral area 103 surrounds the display area 102. The driver IC 106 functions as a control unit that transmits a signal to the scan line drive circuit 104 and a data line drive circuit. The data line drive circuit may be arranged with a sampling switch or the like on a substrate 101 separately from the driver IC 106. In addition, although the driver IC 106 is arranged above a flexible printed circuit (Flexible Print Circuit: FPC) 108, the driver IC 106 may be arranged above the substrate 101. The flexible printed circuit 108 is connected to the plurality of terminals 107 arranged in the peripheral area 103.

In this case, the insulating surface is a surface of the substrate 101. The substrate 101 supports each layer, such as the insulating layer and the conductive layer, arranged above its surface. Also, the substrate 101 may be made of an insulating material, may have an insulating surface, or an insulating film may be separately formed on the substrate 101 to form an insulating surface. The material of the substrate 101 and the material for forming the insulating film are not particularly limited as long as the insulating surface can be obtained.

In the display area 102 shown in FIG. 1, a plurality of pixels 105 is arranged in a matrix in an X-direction and Y-direction. In this specification and the like, a pixel refers to the smallest unit that enables the desired color to be displayed in the display area 102. Each pixel 105 has a pixel circuit and a light-emitting element electrically connected to the pixel circuit. The light emitting element includes a pixel electrode, an organic layer (light-emitting part) including a light-emitting layer stacked on the pixel electrode, and a counter electrode. The light emitting elements included in the pixel 105 emit different colors from each other. For example, the pixel 105 emits a color of either a red light-emitting element, a green light-emitting element, or a blue light-emitting element. Also, the color emitted by the light-emitting element is not limited to the above three colors and may be at least one color. In this specification and the like, the component included in the red light-emitting element is indicated by R, the component included in the green light-emitting element is indicated by G, and the component included in the blue light-emitting element is indicated by B. In addition, an emission peak wavelength of the blue light-emitting element is 450 nm or more and 500 nm or less. An emission peak wavelength of the red light-emitting element is 610 nm or more and 780 nm or less. An emission peak wavelength of the green light-emitting element is 500 nm or more and 570 nm or less.

Each pixel 105 is electrically connected to a scan line 111 and a data line 113. Although not shown, the pixel 105 is electrically connected to a power supply line. The scan line 111 extends along the X-direction and is electrically connected to the scan line drive circuit 104. The data line 113 extends along the Y-direction and is electrically connected to the driver IC 106. In addition, the driver IC 106 outputs a scan signal to the scan line 111 via the scan line drive circuit 104. The driver IC 106 outputs a data signal corresponding to image data to the data line 113. Inputting the scan signal and the data signal to the pixel circuit included in each pixel 105 makes it possible to perform a screen display corresponding to the image data. The pixel circuit is composed of a plurality of transistors. Typically, a thin film transistor (TFT) can be used as the transistor. However, the present invention is not limited to the thin film transistor, and any element having a current control function may be used.

Figure 2:
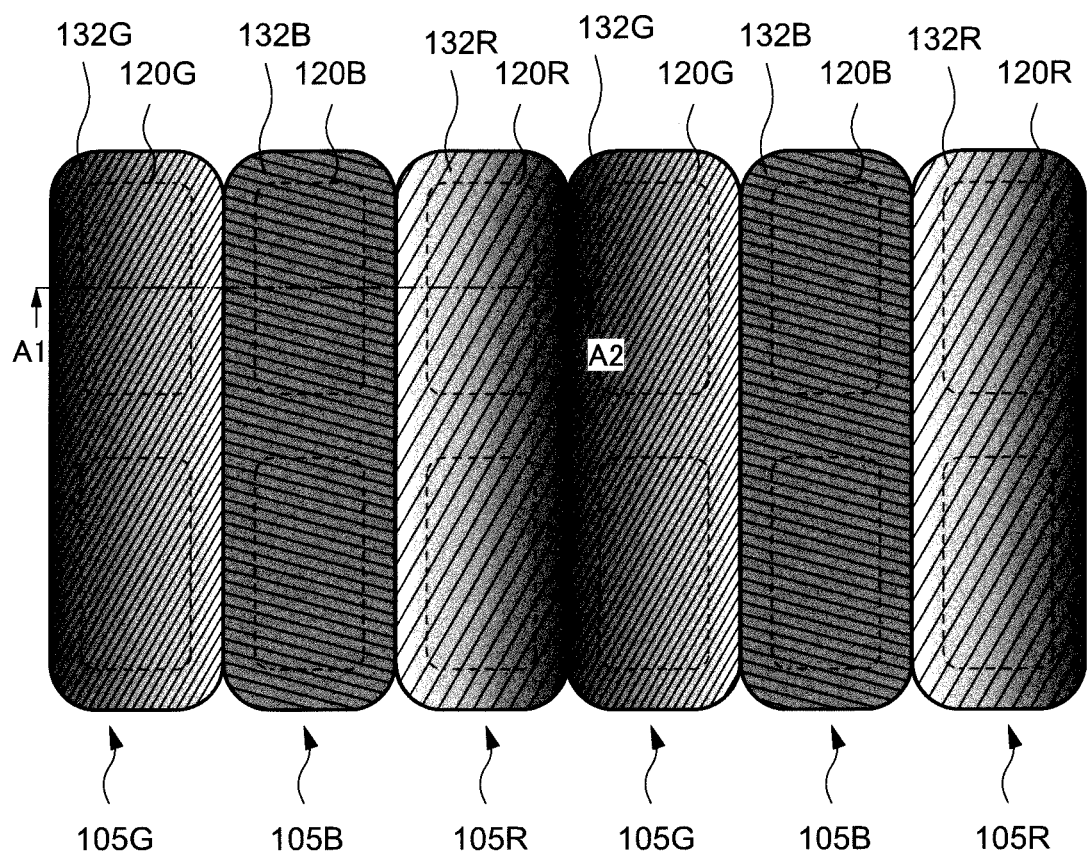
FIG. 2 is an enlarged view of a pixel layout when a display device is in a plan view.
Figure 3:
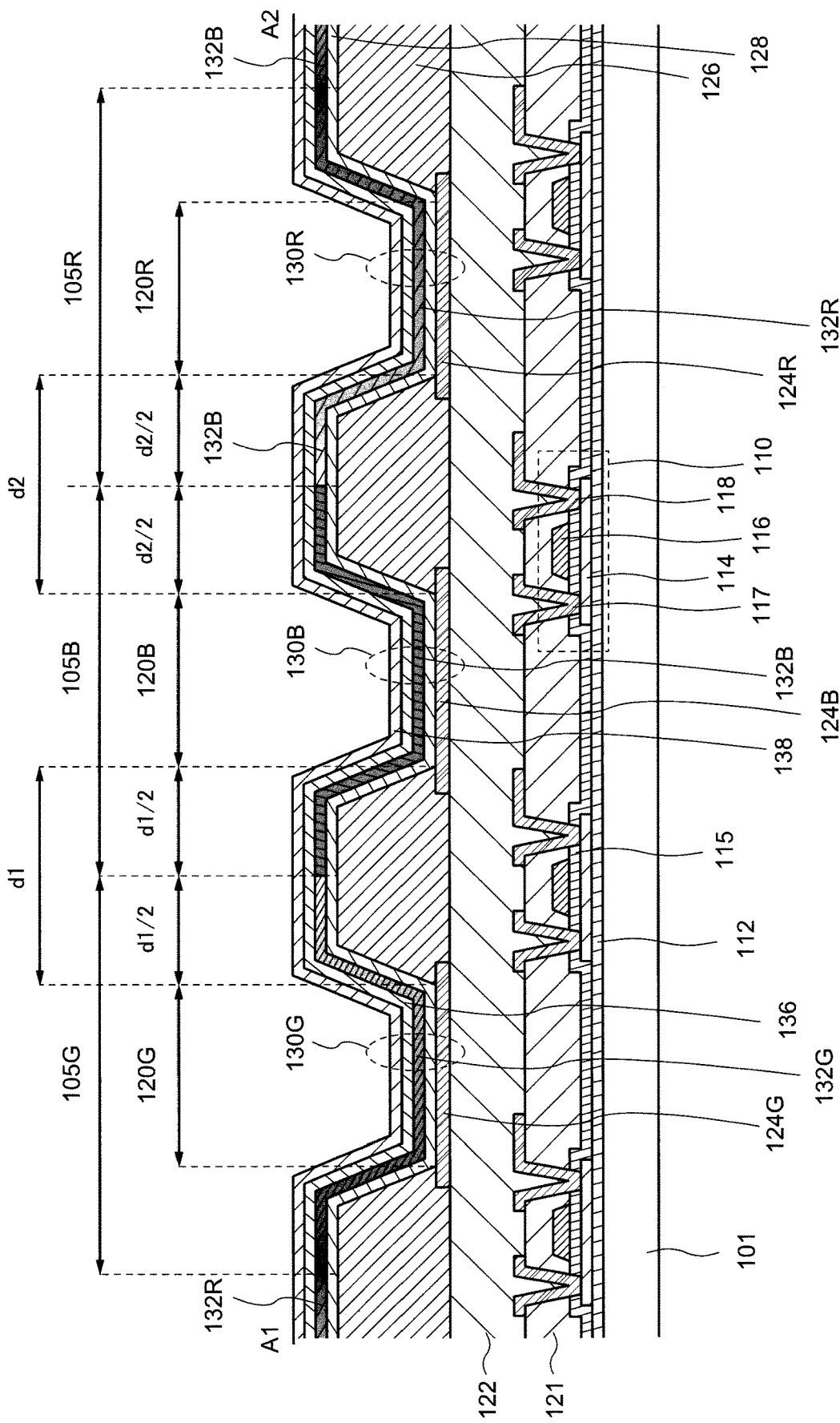
FIG. 3 is a cross-sectional view when a display device shown in FIG. 2 is cut along a line A1-A2.
Figure 4:
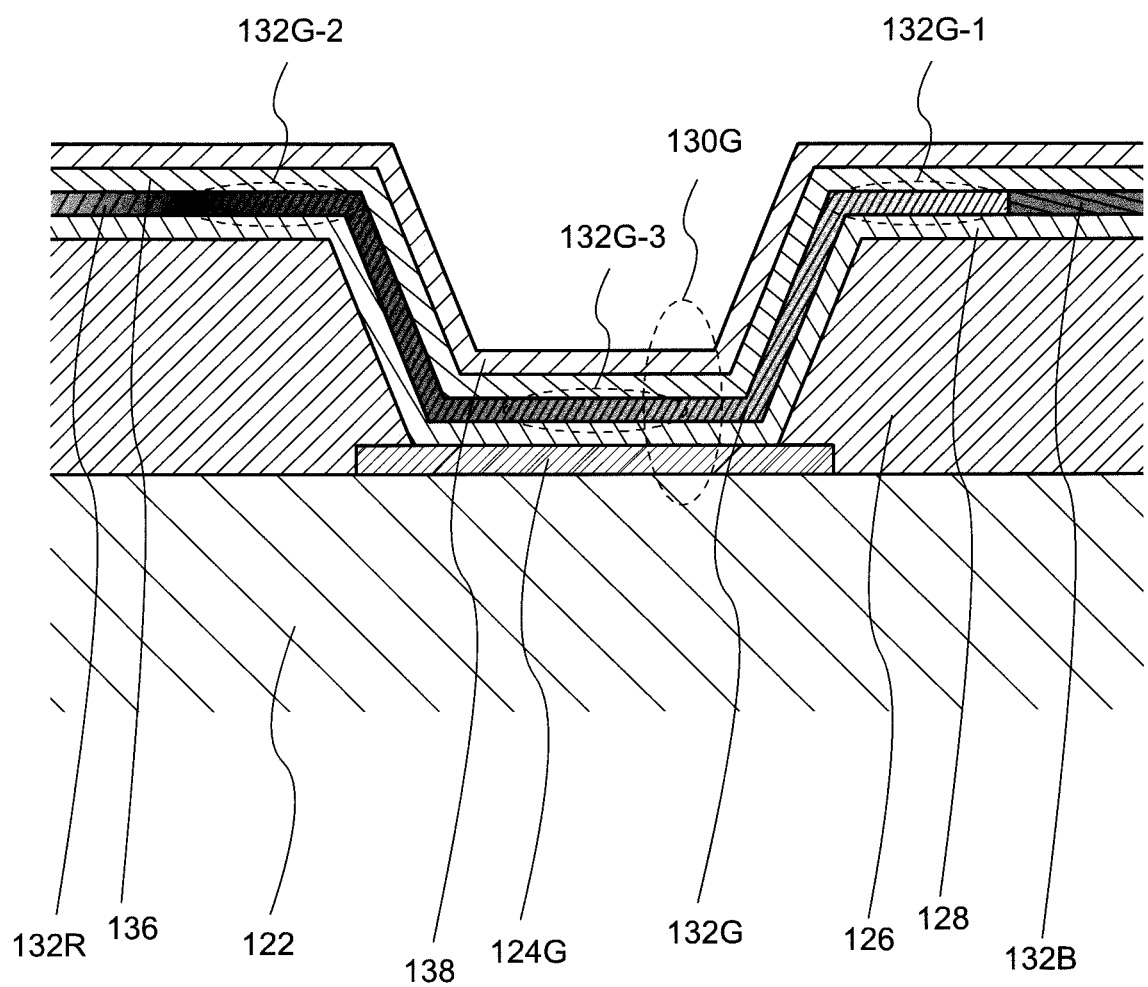
FIG. 4 is a partially enlarged view of the cross-sectional view shown in FIG. 3.

FIG. 2 is an enlarged view of a pixel layout when the display device 100 is in a plan view, and FIG. 3 is a cross-sectional view when the pixel layout shown in FIG. 2 is cut along a line A1-A2. FIG. 4 is a partially enlarged view of the cross-sectional view shown in FIG. 3. In the present embodiment, a configuration of a top-emission display device will be described.

FIG. 2 shows an area where pixels 105R, 105G, and 105B are arranged. The pixel 105R, the pixel 105G, and the pixel 105B are arranged side by side in the X-direction. In addition, the pixel 105R and the pixel 105R, the pixel 105G and the pixel 105G, and the pixel 105B and the pixel 105B are arranged side by side in the Y-direction. In FIG. 2, an area indicated by a solid line is an area where light-emitting layers 132R, 132G, and 132B are arranged. In addition, an area surrounded by a dotted line is an area where openings 120R, 120G, and 120B are arranged in the insulating layer. The insulating layer is also referred to as a barrier or bank. The openings 120R, 120G, and 120B arranged in the insulating layer correspond to a light-emitting area when light-emitting elements 130R, 130G, and 130B actually emit light. Also, if each of the light-emitting elements 130R, 130G, and 130B is not distinguished, they will be collectively described as the light-emitting element 130. In addition, the same applies to each component of the light-emitting elements 130R, 130G, and 130B.

FIG. 3 shows a cross-sectional view of the pixels 105R, 105G, and 105B. A plurality of transistors 110 is arranged above the substrate 101 via an insulating film 112. The plurality of transistors 110 constitutes the pixel circuit. The transistor 110 is composed of at least a semiconductor layer 114, a gate insulating film 115, and a gate electrode 116. An interlayer insulating film 121 is arranged above the transistor 110. A source electrode or drain electrode 117 or 118 is arranged above the interlayer insulating film 121. Each of the source electrode or drain electrode 117 or 118 is connected to the semiconductor layer 114 via a contact hole arranged in the interlayer insulating film 121. An insulating film 122 is arranged above the interlayer insulating film 121. The insulating film 122 can relieve any unevenness caused by the transistor 110 and the source electrode or drain electrode 117 or 118. The plurality of transistors 110 arranged above the substrate 101, and the interlayer insulating film 121 and the insulating film 122 arranged above the transistor 110 are formed by known materials and methods. Also, the configuration of the pixel circuit arranged below the insulating film 122 is omitted after FIG. 4.

The light-emitting element 130R is arranged in the pixel 105R, the light-emitting element 130G is arranged in the pixel 105G, and the light-emitting element 130B is arranged in the pixel 105B on the insulating film 122. The light-emitting element 130R has at least a pixel electrode 124R, the light-emitting layer 132R, and a counter electrode 138. The light-emitting element 130G has at least a pixel electrode 124G, the light-emitting layer 132G, and the counter electrode 138. The light emitting element 130B has at least a pixel electrode 124B, the light-emitting layer 132B, and the counter electrode 138. A common layer 128 is arranged between the pixel electrodes 124R, 124G, and 124B and the light-emitting layers 132R, 132G, and 132B. A common layer 136 is arranged between the light-emitting layers 132R, 132G, and 132B and the counter electrode 138. The common layers 128 and 136 are arranged in common over the light-emitting elements 130R, 130G, and 130B. In FIG. 3, the pixel electrodes 124R, 124G, and 124B are anodes and the counter electrode 138 is a cathode. The common layer 128 includes at least one of a hole transport layer and a hole injection layer, and the common layer 136 includes at least one of an electron transport layer and an electron injection layer. Although not shown in FIG. 3, each of the pixel electrodes 124R, 124G, and 124B is electrically connected to the transistor 110 included in the pixel circuit.

In the present embodiment, when the display device 100 is viewed in a plan view, a first end portion of the light-emitting layer 132B is adjacent to a first end portion of the light-emitting layer 132G. In addition, a second end portion of the light-emitting layer 132B is adjacent to a first end portion of the light-emitting layer 132R. In addition, a second end portion of the light-emitting layer 132G is adjacent to a second end portion of the light-emitting layer 132R. In this case, it is configured so that the dopant concentration at the second end portion of the light-emitting layer 132G separated from a light-emitting area of the light-emitting layer 132B is higher than the dopant concentration at the first end portion of the light-emitting layer 132G adjacent to the first end portion of the light-emitting layer 132B. In addition, it is configured so that the dopant concentration at the second end portion of the light-emitting layer 132R separated from the light-emitting area of the light-emitting layer 132B is higher than the dopant concentration at the first end portion of the light-emitting layer 132R adjacent to the second end portion of the light-emitting layer 132B. In other words, at the first end portion of the light-emitting layer 132G adjacent to the first end portion of the light-emitting layer 132B, it is configured so that a light emission start voltage of the light-emitting layer 132G is high and a light emission start voltage of the second end portion of the light-emitting layer 132G separated from the light-emitting area of the light-emitting layer 132B is low. In addition, at the first end portion of the light-emitting layer 132R adjacent to the second end portion of the light-emitting layer 132B, it is configured so that a light emission start voltage of the light-emitting layer 132R is high and the dopant concentration at the second end portion of the light-emitting layer 132R separated from the light-emitting area of the light-emitting layer 132B is low. Also, the first end portion of the light-emitting layer 132B is preferably arranged so as to be close to the opening 120G of the light-emitting element 130G. In addition, the second end portion of the light-emitting layer 132B is preferably arranged so as to be close to the opening 120R of the light-emitting element 130R. Also, "an end portion of a light-emitting layer" in this specification and the like means an outer edge of the light-emitting layer when the display device 100 is in a plan view.

As the definition of the EL display device increases, the pixel becomes closer to the pixel, and therefore, an effect of a leakage current in the transverse direction flowing between adjacent pixels increases. In the EL display device, the leakage current in the transverse direction may cause the light-emitting layer of the adjacent pixels to emit light, thereby deteriorating the quality of the EL display device.

Hereinafter, a mechanism of the leakage current in the transverse direction in the EL display device causing the light-emitting layer to emit light in an unintended area in adjacent pixels will be described with reference to FIG. 12 to FIG. 16. Also, configurations of pixel circuits arranged below an insulating film 222 are omitted in FIG. 12 to FIG. 16.

Figure 12:
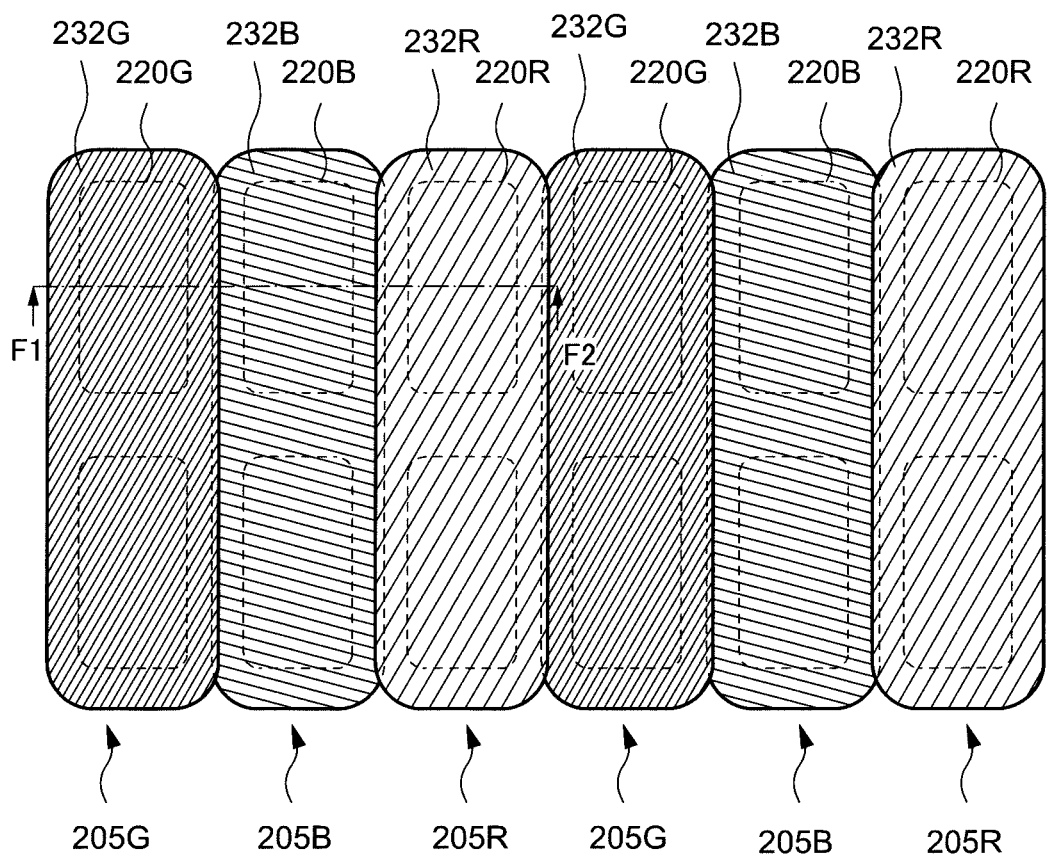
FIG. 12 is an enlarged view of a pixel layout when a conventional display device is in a plan view.
Figure 13:
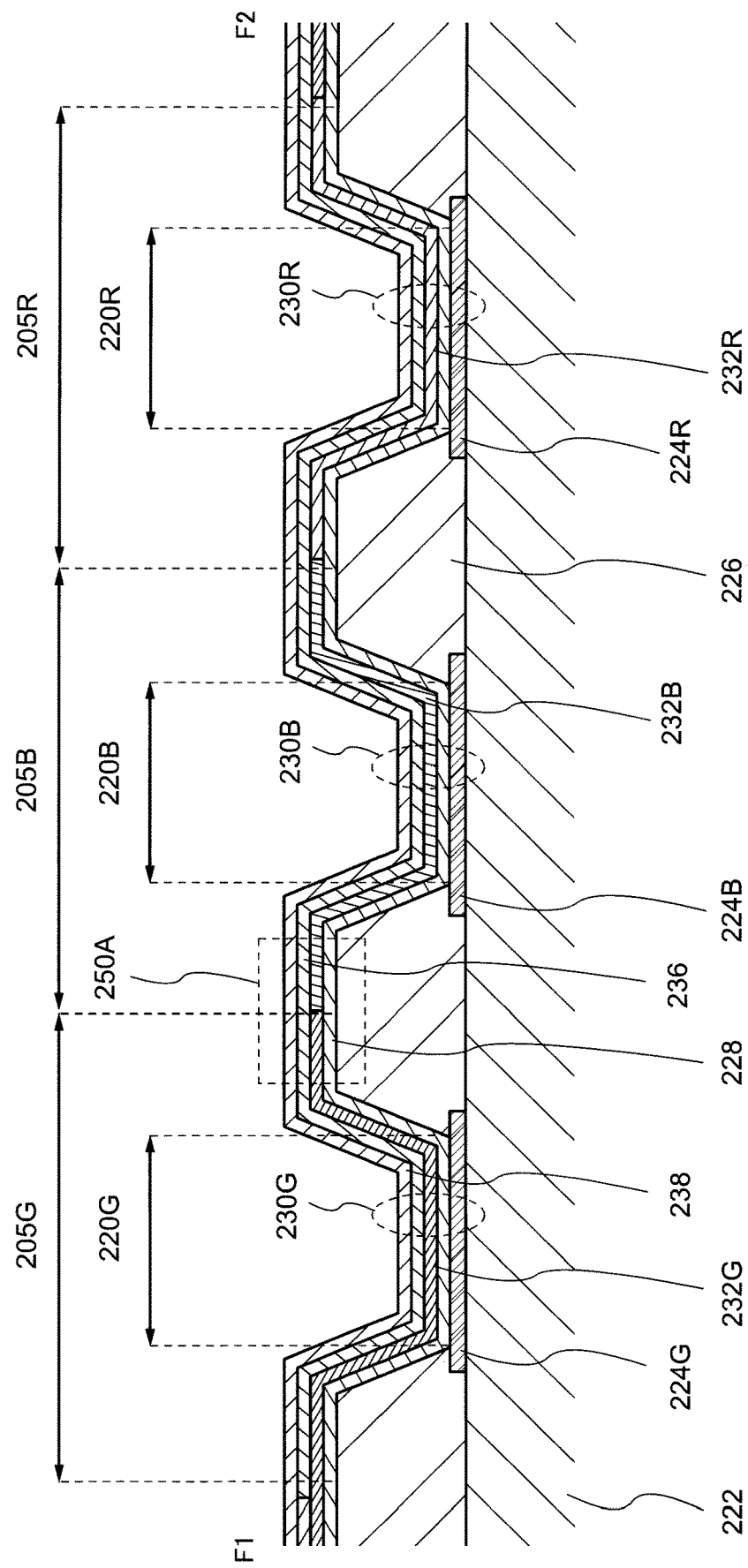
FIG. 13 is a cross-sectional view when a display area shown in FIG. 12 is cut along a line F1-F2.
Figure 14:
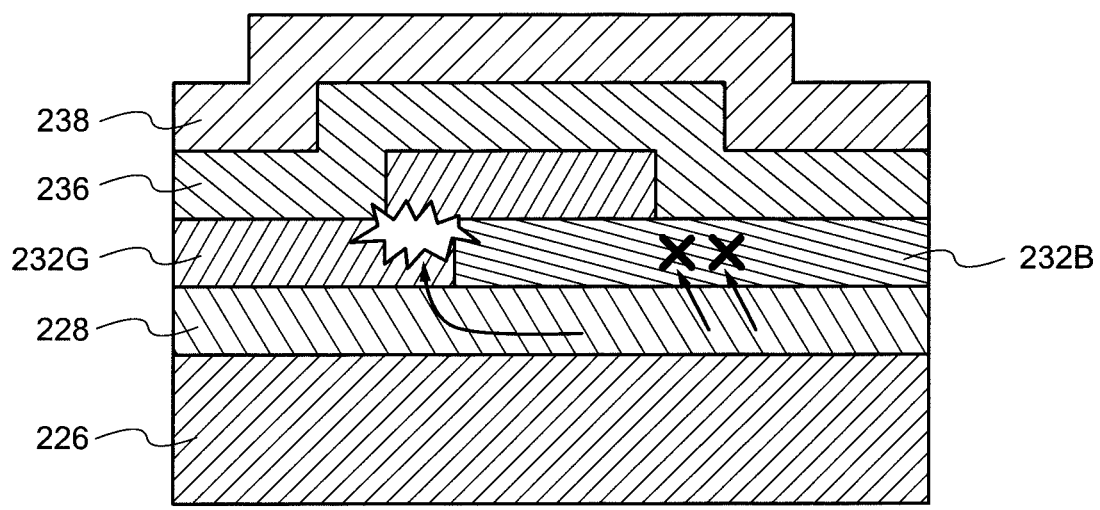
FIG. 14 is a partially enlarged view of the cross-sectional view shown in FIG. 13.

FIG. 12 is an enlarged view of a pixel layout when a conventional display device 200 is in a plan view, and FIG. 13 is a cross-sectional view when the display device 200 shown in FIG. 12 is cut along a line F1-F2. In addition, FIG. 14 is a partially enlarged view of the cross-sectional view shown in FIG. 13.

FIG. 12 shows an area where pixels 205R, 205G, and 205B are arranged. The pixel 205R, the pixel 205G, and the pixel 205B are arranged side by side in the X-direction. In addition, the pixel 205R and the pixel 205R, the pixel 205G and the pixel 205G, and the pixel 205B and the pixel 205B are arranged side by side in the Y-direction. In FIG. 12, an area indicated by a solid line is an area where light-emitting layers 232R, 232G, and 232B are arranged. In addition, an area surrounded by a dotted line is an area where openings 220R, 220G, and 220B are arranged. The openings 220R, 220G, and 220B arranged in the insulating layer correspond to light-emitting areas when light-emitting elements 230R, 230G, and 230B actually emit light. Also, if each of the light-emitting element 230R, 230G, and 230B are not distinguished, they will be collectively described as the light-emitting element 230. In addition, the same applies to each component of the light-emitting elements 230R, 230G, and 230B.

As shown in FIG. 12, a first end portion of the light-emitting layer 232B is adjacent to a first end portion of the light-emitting layer 232G. In addition, a second end portion of the light-emitting layer 232B is adjacent to a first end portion of the light-emitting layer 232R. In addition, a second end portion of the light-emitting layer 232G is adjacent to a second end portion of the light-emitting layer 232R.

FIG. 13 shows a cross-sectional view of the pixels 205R, 205G, and 205B. The light-emitting element 230R is arranged in the pixel 205R, the light-emitting element 230G is arranged in the pixel 205G, and the light-emitting element 230B is arranged in the pixel 205B on the insulating film 222. The light-emitting element 230R has at least a pixel electrode 224R, the light-emitting layer 232R, and the counter electrode 238. The light-emitting element 230G has at least a pixel electrode 224G, the light-emitting layer 232G, and the counter electrode 238. The light-emitting element 230B has at least a pixel electrode 224B, the light-emitting layer 232B, and the counter electrode 238. A common layer 228 is arranged between the pixel electrodes 224R, 224G, and 224B and the light-emitting layers 232R, 232G, and 232B. A common layer 236 is arranged between the light-emitting layers 232R, 232G, and 232B and the counter electrode 238. The common layers 228 and 236 are arranged in common over the light-emitting elements 230R, 230G, and 230B (over the display area). In FIG. 12 to FIG. 14, the pixel electrodes 224R, 224G, and 224B are anodes and the counter electrode 238 is a cathode. Therefore, the common layer 228 includes at least one of the hole transport layer and the hole injection layer, and the common layer 236 includes at least one of the electron transport layer and the electron injection layer.

In order to suppress unintended light emission in adjacent pixels, areas arranged with the light-emitting layer are preferred to be separated from each other so as not to overlap. However, in order for the areas arranged with the light-emitting layer to be separatory formed so as not to overlap each other, the openings 220R, 220G, and 220B need to be formed sufficiently separate from each other, and the definition deteriorates.

Therefore, as the definition of the display area is increased, the areas where the light-emitting layer is arranged may overlap. As shown in FIG. 14, a part of the light-emitting layer 232G and a part of the light-emitting layer 232B may overlap in the area where the pixel 205G and the pixel 205B are adjacent to each other.

FIG. 14 shows an enlarged view of an area 250A where the pixel 205G and the pixel 205B are adjacent to each other. The light-emitting layer 232B and the light-emitting layer 232G are arranged above the common layer 228 on an insulating layer 226. A part of the light-emitting layer 232B overlaps with a part of the light-emitting layer 232G. Generally, a light emission start voltage of the light-emitting layer 232B is higher than light emission start voltages of the light-emitting layer 232R and the light-emitting layer 232G. Therefore, when the light-emitting element 230B is caused to emit light, a high voltage is applied to the light-emitting layer 232B, so that the holes in the common layer 228 move in the transverse direction from the pixel 205B to the pixel 205R and the pixel 205G. If the light-emitting layer 232B exhibits a hole-transport property, the holes pass through the light-emitting layer 232B in the thickness direction. Therefore, the light-emitting layer 232G emits light at an end portion of the light-emitting layer 232G. Alternatively, if the light-emitting layer 232B exhibits an electron-transport property, the hole does not pass through the light-emitting layer 232B in the thickness direction but moves in the transverse direction. Therefore, the light-emitting layer 232G emits light in the vicinity of the end portion of the light-emitting layer 232B. In this specification and the like, a position where unintended light emission occurs in the light-emitting layer 232R or the light-emitting layer 232G adjacent to the light-emitting layer 232B is referred to as a starting point of light emission. Also, the light emission start voltage of the light-emitting layer 232R and the light emission start voltage of the light-emitting layer 232G are approximately the same. Therefore, even if the light-emitting element 230G is caused to emit light, the holes in the common layer 228 are prevented from moving in the transverse direction from the pixel 205G to the pixel 205R and the pixel 205B. Therefore, an end portion of the light-emitting layer 232R and the light-emitting layer 232G do not emit light in an area where the end portion of the light-emitting layer 232R overlaps the end portion of the light-emitting layer 232G.

Figure 15:
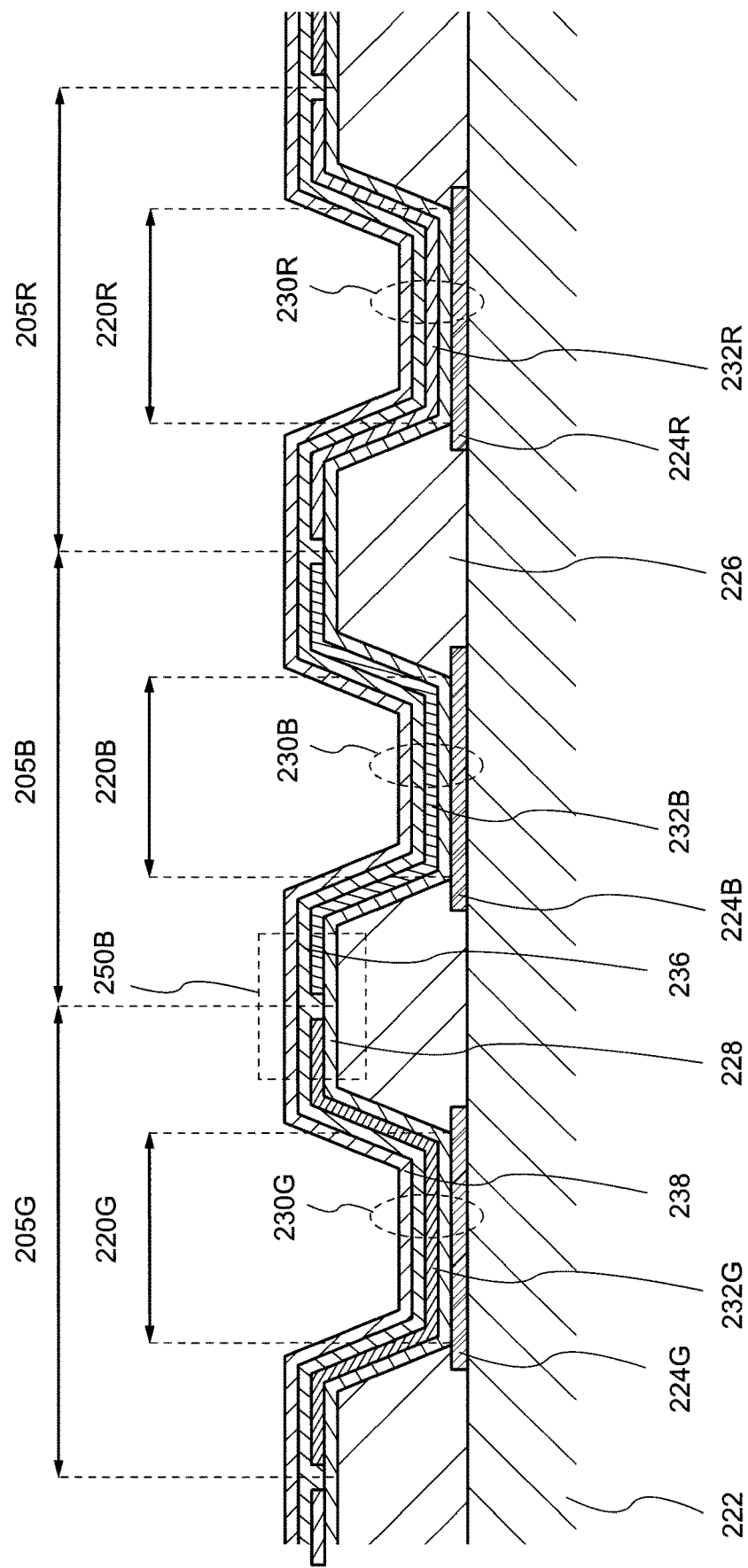
FIG. 15 is a cross-sectional view when a display area shown in FIG. 15 is cut along a line F1-F2.

As shown in FIG. 15, in the area where the pixel 205G and the pixel 205B are adjacent to each other, a part of the light-emitting layer 232G and a part of the light-emitting layer 232B may be separated.

Figure 16:
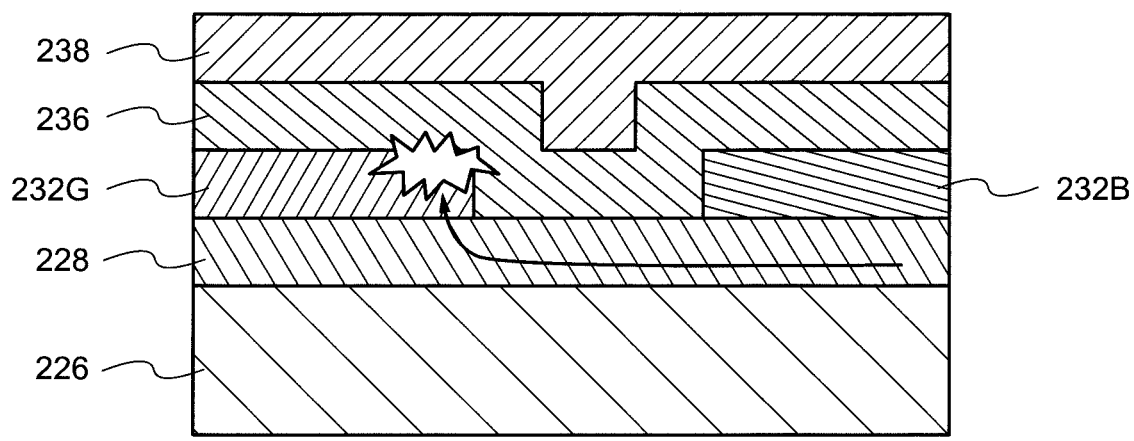
FIG. 16 is a partially enlarged view of the cross-sectional view shown in FIG. 15.

FIG. 16 shows an enlarged view of an area 250B where the pixel 205G and the pixel 205B adjacent to each other. The light-emitting layer 232B and the light-emitting layer 232G are arranged above the common layer 228 on the insulating layer 226. The end portion of the light-emitting layer 232B is separated from the end portion of the light-emitting layer 232G. The light emission start voltage of the light-emitting layer 232B is higher than the light emission start voltages of the light-emitting layer 232G and the light-emitting layer 232R. Therefore, when the light-emitting element 230B is caused to emit light, a high voltage is applied to the light-emitting layer 232B, so that the holes in the common layer 228 move in the transverse direction from the pixel 205B to the pixel 205G and the pixel 205R. If the light-emitting layer 232B exhibits an electron-transport property, the holes do not pass through the light-emitting layer 232B in the thickness direction but move in the transverse direction. Therefore, the light-emitting layer 232G emits light even if the end portion of the light-emitting layer 232G is separated from the end portion of the light-emitting layer 232B.

As described above, since the emission start voltages of the light-emitting layers 232R, 232G, and 232B are different from each other, even if the light-emitting layer 232B overlaps or does not overlap the adjacent light-emitting layers 232R and 232G, a leakage current in the transverse direction occurs, and the light-emitting layer emits light in an unintended area. In order to suppress unintended light emission in each light-emitting layer, it is conceivable to prevent the leakage current in the transverse direction by designing the light emission start voltages of the light-emitting layers 232R, 232G, and 232B to coincide with each other. However, it is a trade-off with the property of the light-emitting element due to the need for designs such as suppressing the property of the light-emitting element and carrier injections into the light-emitting layer. As described above, conventionally, it has been difficult to prevent unintentional light emission caused by the leakage current in the transverse direction while improving the property of the light-emitting element.

As described in FIG. 12 to FIG. 16, the starting point of light emission differs depending on the order in which the common layer 228 and the light-emitting layers 232R, 232G, and 232B are stacked. In addition, the strength of the leakage current in the transverse direction depends on a distance from the light-emitting area of the light-emitting element 230B. Therefore, when the distance between the light-emitting area of the light-emitting element 230B and the end portion of the light-emitting layer 232B is designed to be small by increasing the definition, the strength of the leakage current increases. Therefore, the intensity of the unintended light emission in the light-emitting layer 232R and the light-emitting layer 232G arranged so as to overlap or be separated from the end portion of the light-emitting layer 232B also increases.

Therefore, in the display device 100 according to an embodiment of the present invention, gradients of the light emission start voltages of the light-emitting layers 132R and 132G are set so that the light emission start voltage in the area where the end portions of the light-emitting layers 132R and 132G of the light-emitting elements 130R and 130G having a low light emission start voltage are adjacent to the end portion of the light-emitting layer 132B of the light-emitting element 130B having a higher light emission start voltage than the light-emitting elements 130R and 130G, that is, where the area of the light-emitting layers 132R and 132G adjacent to the end portion of the light-emitting layer 132B where unintended light emission is likely to occur is high, and the light emission start voltage in the area of the light-emitting layers 132R and 132G separated from the light-emitting area of the light-emitting element 132B is low. This suppresses light emission at the end portion of the light-emitting layers 132R and 132G. Specifically, the dopant concentration at the end portions of the light-emitting layers 132R and 132G adjacent to the end portion of the light-emitting layer 132B is decreased, and the dopant concentration at the end portions of the light-emitting layers 132R and 132G separated from the light-emitting area of the light-emitting layer 132B is increased. In the present embodiment, an example in which a pixel electrode functions as an anode will be described.

In the present embodiment, the case where the light emission start voltage of the light-emitting element 130B is higher than the light emission start voltages of the light-emitting elements 130R and 130G will be described as an example. However, even when the light emission start voltage of the light-emitting element 130R is higher than the light emission start voltages of the light-emitting elements 130G and 130B or when the light emission start voltage of the light-emitting element 130G is higher than the light emission start voltages of the light-emitting elements 130R and 130B, it is possible to obtain the advantage according to the present embodiment by decreasing the dopant concentration at the area adjacent to the end portion of the light-emitting layer of the light-emitting element where the light emission start voltage is high and by increasing the dopant concentration at the end portion of the light-emitting layer of the light-emitting element where the light emission start voltage is low separated from the light-emitting area of the light-emitting layer of the light-emitting element where the light emission start voltage is high.

FIG. 4 is a partially enlarged view of the cross-sectional view shown in FIG. 3. FIG. 4 shows an enlarged view of the light-emitting element 130G. As shown in FIG. 4, in a cross-sectional view, a gradient is set to the dopant concentration in the light-emitting layer 132G so that the dopant concentration in a second area 132G-2 at the end portion of the light-emitting layer 132G adjacent to the light-emitting layer 132R is higher than the dopant concentration in a first area 132G-1 at the end portion of the light-emitting layer 132G adjacent to the light-emitting layer 132B. In addition, the light-emitting layer 132G has a third area 132G-3 having a third dopant concentration in an area inside the opening 120G that is higher than a first dopant concentration in the first area 132G-1 and lower than a second dopant concentration in the second area 132G-2. In this case, in this specification and the like, the display device 100 is cut along a plane or a curved surface intersecting the insulating surface, and a state in which the cut surface is viewed from a plane parallel to the screen is referred to as a "cross-sectional view."

The first dopant concentration in the first area 132G-1 can be set, for example, to one-fifth or less, preferably one-tenth or less of the third dopant concentration in the third area 132G-3. In addition, the second dopant concentration in the second area 132G-2 can be set to, for example, five-fold or more, preferably ten-fold or more of the third dopant concentration in the third area 132G-3.

In addition, as shown in FIG. 14, the first area 132G-1 at the end portion of the light-emitting layer 132G may be arranged so as to overlap the end portion of the light-emitting layer 132B. Alternatively, the end portion of the light-emitting layer 132B may be arranged so as to be close to the light-emitting area (the opening 120G) of the light-emitting element 130G. In FIG. 3, when a distance from an end portion of the opening 120B to an end portion of the opening 120G is d1, the end portion of the light-emitting layer 132B is set to a length of d1/2. In an embodiment, the end portion of the light-emitting layer 132B may be set to be longer than d1/2. That is, the end portion of the light-emitting layer 132B may be arranged on a side closer to the opening 120G than an intermediate part d1/2 between the end portion of the opening 120G and the end portion of the opening 120B. In this case, the end portion of the opening 120B refers to a part in contact with the pixel electrode 124B. In addition, the end portion of the opening 120G refers to a part in contact with the pixel electrode 124G.

Although an end portion of the light-emitting layer 132R adjacent to the light-emitting layer 132B is not shown in detail in FIG. 4, it is the same as an end portion 132B-1 of the light-emitting layer 132B. That is, a gradient is set to the dopant concentration in the light-emitting layer 132R so that the dopant concentration in the second area at the end portion of the light-emitting layer 132R adjacent to the light-emitting layer 132G is higher than the dopant concentration in the first area at the end portion of the light-emitting layer 132R adjacent to the light-emitting layer 132B. In addition, the light-emitting layer 132R has a third area having a third dopant concentration in an area inside the opening 120R that is higher than the first dopant concentration in the first area and lower than the second dopant concentration in the second area.

The first dopant concentration in the first area 132R-1 can be set, for example, to one-fifth or less, preferably one-tenth or less of the third dopant concentration in a third area 132R-3. In addition, the second dopant concentration in the second area 132R-2 may be set to, for example, five-fold or more, preferably ten-fold or more of the third dopant concentration in the third area 132R-3.

In addition, the first area at the end portion of the light-emitting layer 132R may be arranged so as to overlap the end portion of the light-emitting layer 132B. Alternatively, the end portion of the light-emitting layer 132B may be arranged so as to be close to the light-emitting area (the opening 120R) of the light-emitting element 130R. In FIG. 3, when a distance from the end portion of the opening 120B to the end portion of the opening 120G is d2, the end portion of the light-emitting layer 132B is set to a length of d2/2. In an embodiment, the end portion of the light-emitting layer 132B may be set to be longer than d2/2. That is, the end portion of the light-emitting layer 132B may be arranged on a side closer to the opening 120R than an intermediate part d2/2 between the end portion of the opening 120R and the end portion of the opening 120B.

In this way, decreasing the dopant concentration in the light-emitting layers 132R and 132G adjacent to the end portion of the light-emitting layer 132B where unintended light emission is likely to occur makes it is possible to increase the light emission start voltage in the areas of the light-emitting layers 123R and 132G adjacent to the end portion of the light-emitting layer 132B, thereby reducing the leakage current in the transverse direction or the thickness direction of the light-emitting layer 132B. As a result, it is possible to suppress the occurrence of unintended light emission in the light-emitting layer 132R or the light-emitting layer 132G.

Although not shown in FIG. 3 and FIG. 4, a sealing film may be arranged above the light-emitting elements 130R, 130G, and 130B. The sealing film is composed by combining an inorganic insulating film and an organic insulating film. As a result, it is possible to prevent water from entering into the organic layer including the light-emitting layer 132 and the common layers 128 and 136 in the light-emitting elements 130R, 130G, and 130B.

<Method for Manufacturing Display Device>

Figure 17:
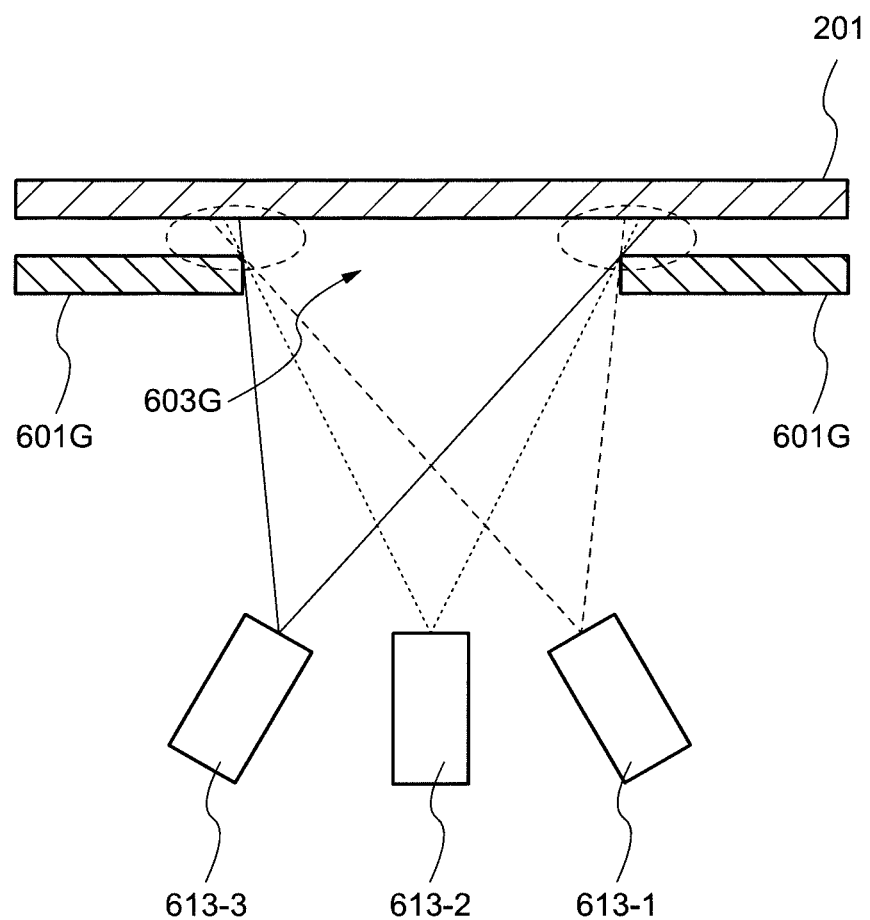
FIG. 17 is a cross-sectional view illustrating a method for manufacturing a conventional light-emitting layer.

A method for manufacturing the light-emitting layers 232R, 232G, and 232B in the conventional display device 200 will be described. FIG. 17 is a diagram illustrating a method for manufacturing a light-emitting layer by a vacuum deposition method. FIG. 17 shows an example of using three deposition sources 613-1 to 613-3. Although not shown, each layer up to the common layer 228 described in FIG. 13 is arranged above a substrate 201. A mask 601G is arranged above the substrate 201 to form the light-emitting layer 232G. The mask 601G has an opening 603G, and the opening 603G is aligned on the substrate 201 at a position where the light-emitting layer 232G is formed. In the method for manufacturing the conventional display device 200, the inclination and/or directivity of the deposition source for the substrate 201 is controlled to stabilize a concentration distribution in the cross-sectional direction. For this reason, for example, a deposition source of a first host material is arranged in the deposition source 613-1, a deposition source of a dopant is arranged in the deposition source 613-2, and a deposition source of a second host material is arranged in the deposition source 613-3. Arranging the deposition source in this manner makes it possible to form the light-emitting layer 232G having a uniform dopant-concentration in a plan view and a cross-sectional view.

In this case, a shadow of each material from the deposition source occurs in an area surrounded by a dashed line between the substrate 201 and the mask 601G. The shadow area is caused by differences in the shape of the mask, the distance between the deposition source and the substrate, and the angle of the deposition source with respect to the substrate.

In the method for manufacturing the display device 100 of the present embodiment, the arrangement of the deposition source is devised to control the distribution of the dopant concentration in the light-emitting layer to suppress the occurrence of unintended light emission in the light-emitting layer 132R or the light-emitting layer 132G described above. The method for manufacturing the display device 100 will be described with reference to FIG. 5 to FIG. 9.

Figure 5:
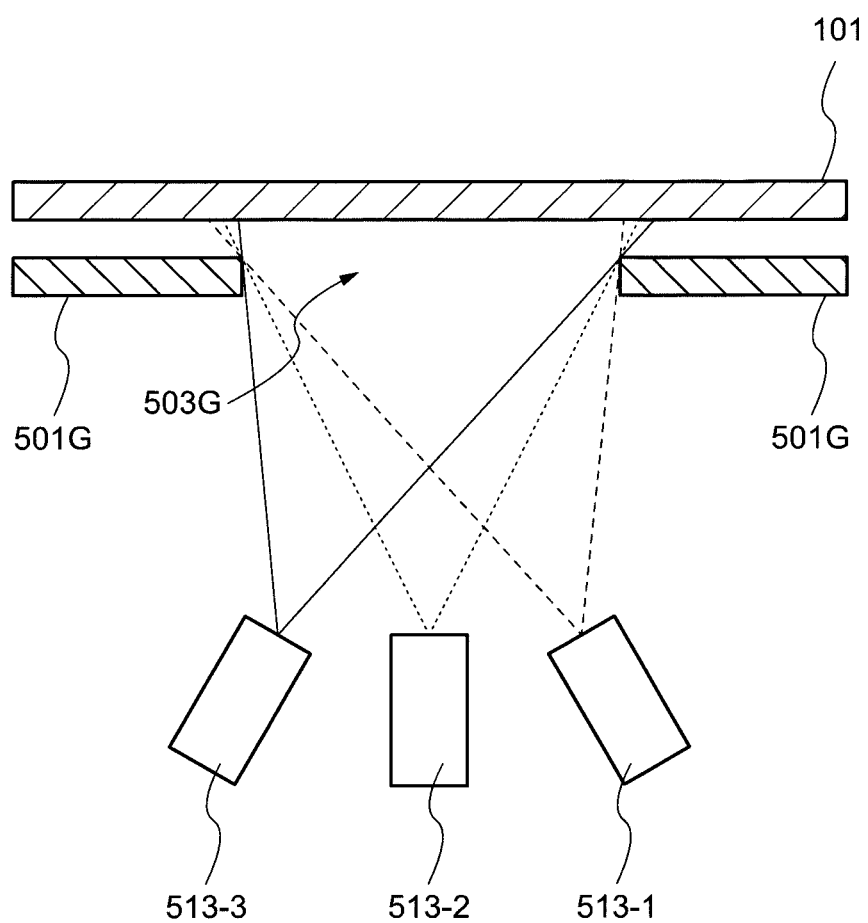
FIG. 5 is a cross-sectional view illustrating a method for manufacturing a light-emitting layer according to an embodiment of the present invention.

FIG. 5 shows an example of using three deposition sources 513G-1 to 513G-3. Although not shown, each layer up to the common layer 128 described with reference to FIG. 3 and FIG. 4 is arranged above the substrate 101. A mask 501G is arranged above the substrate 101 to form the light-emitting layer 132G. The mask 501G has an opening 503G, and the opening 503G is aligned above the substrate 101 at a position where the light-emitting layer 132G is formed. In the present embodiment, a dopant deposition source 513-1 is arranged on a side of the end portion of the light-emitting layer 132B, a deposition source 513-3 of the first host material is arranged on a side of the end portion of the light-emitting layer 132R, and a deposition source 513-2 of the second host material is arranged between the deposition source 513-1 and the deposition source 513-3, preferably at a position corresponding to the surface normally passing through the center of the opening 503G.

The deposition of the dopant is suppressed in the shadow area adjacent to the end portion of the light-emitting layer 132B by arranging the deposition sources in this manner, and the first area 132G-1 with a low dopant concentration (or almost no dopant) is formed. On the other hand, the deposition of the first host material is suppressed (or almost no first host material) in the shadow area adjacent to the end portion of the light-emitting layer 132R, and the dopant concentration in the second area 132G-2 adjacent to end portion of the light-emitting layer 132R is higher than the first dopant concentration. In addition, the third area 132G-3 having the third dopant concentration that is higher than the first dopant concentration in the first area 132G-1 and lower than the second dopant concentration in the second area 132G-2 is formed in the area inside the opening 120G.

Although not shown, a transistor constituting a pixel circuit is arranged above the substrate 101. Also, a detailed description of a method for manufacturing the pixel circuit formed on the substrate 101 will be omitted because a known method for manufacturing a transistor can be applied. An interlayer insulating film containing at least one of silicon oxide and silicon nitride is formed on the transistor. A source electrode and a drain electrode are formed on the interlayer insulating film.

Figure 6:
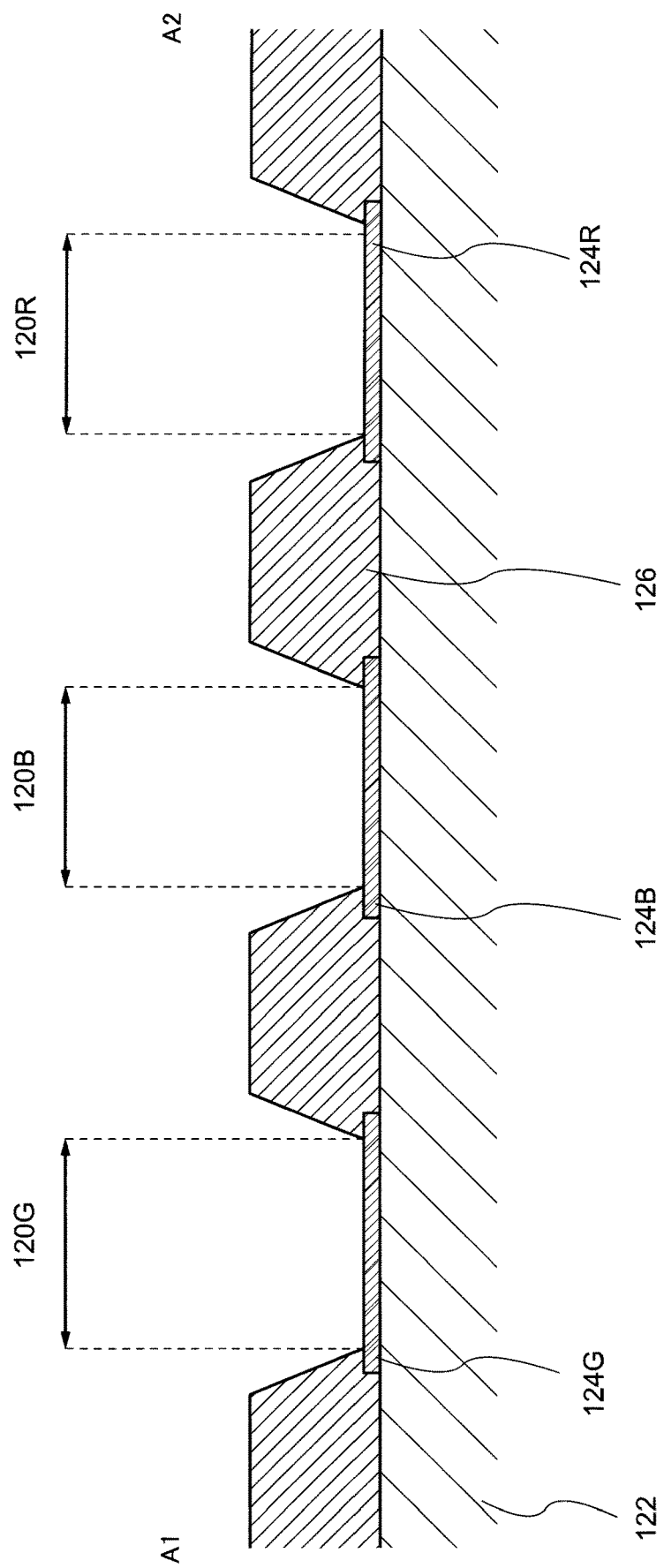
FIG. 6 is a cross-sectional view illustrating a method for manufacturing a display device according to an embodiment of the present invention.

FIG. 6 is a diagram illustrating a process for forming the insulating film 122, the pixel electrodes 124R, 124G, and 124B, and an insulating layer 126. The insulating film 122 functions as a flattening film. The insulating film 122 is made of an organic resin material. The organic resin material may be a known organic resin material such as a polyimide-based, polyamide-based, acrylic-based, epoxy-based, or siloxane-based organic resin. Arranging the insulating film 122 on the transistor or the interlayer insulating film makes it possible to relieve any unevenness of the transistor. A contact hole is formed in the insulating film 122.

The pixel electrodes 124R, 124G, and 124B are formed on the insulating film 122. Each of the pixel electrodes 124R, 124G, and 124B is electrically connected to the source electrode or the drain electrode connected to the transistor via the contact hole arranged in the insulating film 122. In the present embodiment, the pixel electrodes 124R, 124G, and 124B function as anodes. A highly reflective metal film is used as the pixel electrodes 124R, 124G, and 124B. Alternatively, a stacked structure of a high-work-function transparent conductive layer such as an indium-oxide-based transparent conductive layer (e.g., ITO) or a zinc-oxide-based transparent conductive layer (e.g., IZO, ZnO) and the metal film is used as the pixel electrodes 124R, 124G, and 124B.

The insulating layer 126 made of an organic resin material is formed on the pixel electrodes 124R, 124G, and 124B. A known organic resin material such as a polyimide-based, polyamide-based, acrylic-based, epoxy-based, or siloxane-based organic resin material can be used. The insulating layer 126 has the openings 120R, 120G, and 120B for each of a part of the pixel electrode 124R, a part of the pixel electrode 124G, and a part of the pixel electrode 124B. The insulating layer 126 is arranged between the adjacent pixel electrodes 124R, 124G, and 124B so as to cover end portions (edges) of the pixel electrodes 124R, 124G, and 124B. The insulating layer 126 functions as a member that separates the adjacent pixel electrodes 124R, 124G, and 124B. Therefore, the insulating layer 126 is also commonly referred to as a "barrier" or a "bank." A part of the pixel electrodes 124R, 124G, and 124B exposed by the openings 120R, 120G, and 120B of the insulating layer 126 is the light-emitting area of the light-emitting elements 130R, 130G, and 130B. The openings 120R, 120G, and 120B of the insulating layer 126 are preferably such that the inner wall is a tapered shape. Therefore, when forming the common layer 128 and the light-emitting layers 132R, 132G, and 132B, which will be described later, it is possible to reduce a coverage defect at the end portion of the pixel electrodes 124R, 124G, and 124B.

Figure 7:
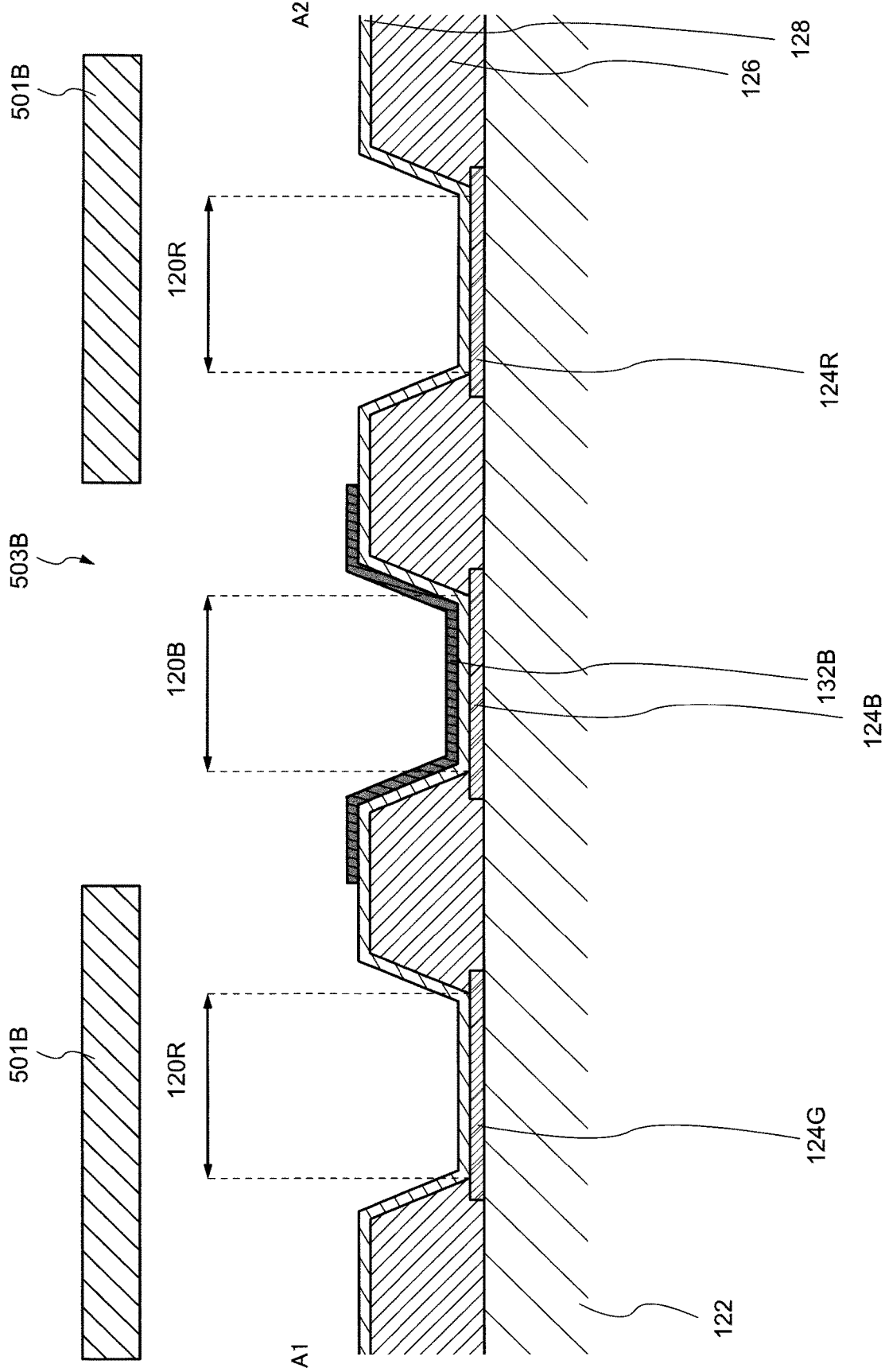
FIG. 7 is a cross-sectional view illustrating a method for manufacturing a display device according to an embodiment of the present invention.

FIG. 7 is a diagram illustrating a process for forming the common layer 128 and the light-emitting layer 132B. The common layer 128 is formed on the pixel electrodes 124R, 124G, and 124B and the insulating layer 126. The common layer 128 includes at least one of the hole transport layer and the hole injection layer. Known materials may be used as the hole transport layer and the hole injection layer as appropriate.

The light-emitting layers 132R, 132G, and 132B are preferably formed in the order of the light-emitting layer having the highest light emission start voltage. In the present embodiment, the light emission start voltage of the light-emitting layer 132B is higher than the light emission start voltages of the light-emitting layer 132R and the light-emitting layer 132G. Therefore, the light-emitting layer 132B is first formed on the common layer 128. As shown in FIG. 7, the light-emitting layer 132B is formed by arranging a mask 501B above the substrate 101 and depositing the material via an opening 503B. In this case, the first end portion of the light-emitting layer 132B may be formed so as to be close to the opening 120R arranged in the insulating layer 126. In addition, the second end portion of the light-emitting layer 132B may be formed so as to be close to the opening 120G arranged in the insulating layer 126. The light-emitting layer 132B is preferably a light-emitting material having an electron-transport property, and a known material may be appropriately used.

Figure 8:
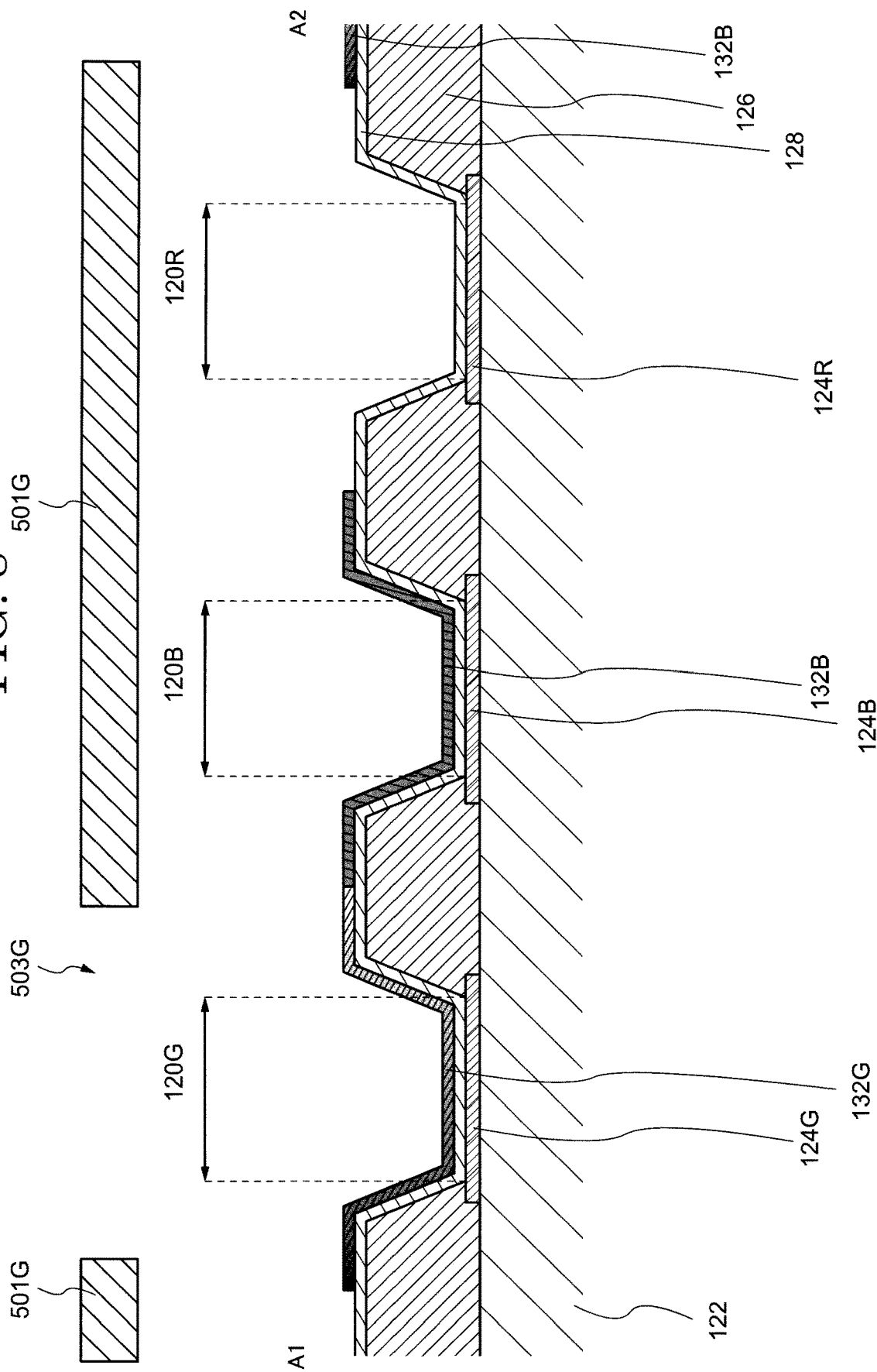
FIG. 8 is a cross-sectional view illustrating a method for manufacturing a display device according to an embodiment of the present invention.

FIG. 8 is a diagram illustrating a process for forming the light-emitting layer 132G. The light-emitting layer 132G is formed by arranging the mask 501G above the substrate 101 and depositing the material via the opening 503G. As shown in FIG. 5, the dopant deposition source 513G-1 is arranged on a side of the end portion of the light-emitting layer 132B, the deposition source 513G-3 of the first host material is arranged on a side of the end portion of the light-emitting layer 132R, and the deposition source 513G-3 of the second host material is arranged between the deposition source 513G-1 and the deposition source 513G-3, preferably at a position corresponding to the surface normally passing through the center of the opening 503G.

Arranging the deposition sources in this manner suppresses the deposition of the dopant in the shadow area adjacent to the end portion of the light-emitting layer 132B, and the first area 132G-1 with a low dopant concentration (or almost no dopant) is formed. On the other hand, the dopant concentration in the second area 132G-2 adjacent to the end portion of the light-emitting layer 132R is higher than the first dopant concentration. In addition, the third area 132G-3 having the third dopant concentration that is higher than the first dopant concentration in the first area 132G-1 and lower than the second dopant concentration in the second area 132G-2 is formed in the opening 120G.

Figure 9:
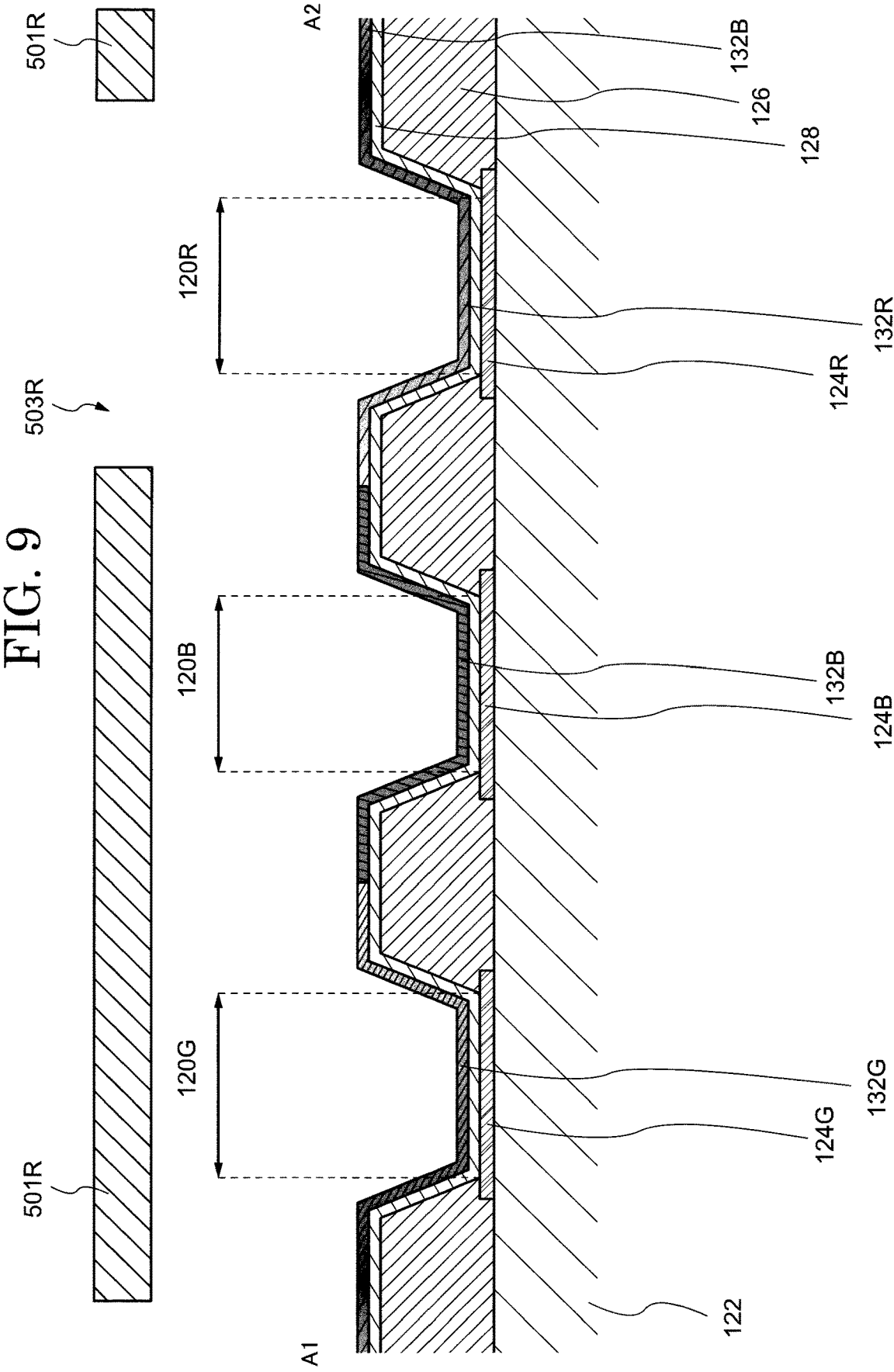
FIG. 9 is a cross-sectional view illustrating a method for manufacturing a display device according to an embodiment of the present invention.

FIG. 9 is a diagram illustrating a process for forming the light-emitting layer 132R. The light-emitting layer 132R is formed by arranging a mask 501R above the substrate 101 and depositing the material via an opening 503R. Although not shown, similar to FIG. 5, the dopant deposition source is arranged on a side of the end portion of the light-emitting layer 132B, the deposition source of the first host material is arranged on a side of the end portion of the light-emitting layer 132R, and the deposition source of the second host material is arranged between the dopant deposition source and the deposition source of the first host material, preferably at a position corresponding to the surface normally through the center of the opening 503G.

Arranging the deposition sources in this manner suppresses the deposition of the dopant in the shadow area adjacent to the end portion of the light-emitting layer 132B, and the first area with a low dopant concentration (or almost no dopant) is formed. On the other hand, the dopant concentration in the second area adjacent to the end portion of the light-emitting layer 132G is higher than the first dopant concentration. In addition, a third area having the third dopant concentration that is higher than the first dopant concentration in the first area and lower than the second dopant concentration in the second area is formed in the opening 120R.

Although not shown, next, the common layer 136 is then formed on the light-emitting layers 132R, 132G, and 132B. The common layer 136 includes at least one of the electron transport layer and the electron injection layer. Known materials may be used as the electron transport layer and the electron injection layer as appropriate. Finally, the display device 100 shown in FIG. 3 can be formed by forming the counter electrode 138 on the common layer 136.

In the present embodiment, although the case where the light-emitting layer 132R is formed after the light-emitting layer 132G is formed is described, the present invention is not limited to this, and either of them may be formed first.

In FIG. 2, although the structure in which the end portion of the light-emitting layer 132R and the end portion of the light-emitting layer 132G adjacent to each other do not overlap is shown, the end portion of the light-emitting layer 132R and the end portion of the light-emitting layer 132G adjacent to each other may overlap. This is because, if the light emission start voltage of the light-emitting layer 132R and the light emission start voltage of the light-emitting layer 132G are approximately the same, even if the light-emitting element 130R or the light-emitting element 130G emits light, the effect of the leakage current in the transverse direction from the light-emitting layer 132R and the light-emitting layer 132G is small.

In addition, in the present embodiment, the method for manufacturing the display device 100 has been described as exemplifying the case where the light emission start voltage of the light-emitting element 130B is higher than the light emission start voltages of the light-emitting elements 130R and 130G. However, even when the light emission start voltage of the light-emitting element 130R is higher than the light emission start voltage of the light-emitting elements 130G and 130B or when the light emission start voltage of the light-emitting element 130G is higher than the light emission start voltage of the light-emitting elements 130R and 130B, the display device 100 according to the present embodiment can be manufactured by forming the concentration gradient of the carrier in the light-emitting layer of the light-emitting element having the low light emission start voltage so that the carrier concentration in the area adjacent to the end portion of the light-emitting layer of the light-emitting element having the high emission start voltage is low.

The display device 100 according to an embodiment of the present invention is not limited to the configuration shown in FIG. 2 to FIG. 4. For example, the arrangement of the pixels 105R, 105G, and 105B is not limited to the arrangement of the pixels 105R, 105G, and 105B shown in FIG. 2.

<Modification 1>

Next, a display device 100A according to Modification 1 in which a part of the components of the display device 100 is modified will be described with reference to FIG. 10. In the display device 100A according to Modification 1, the arrangement of the light-emitting layers 132R, 132G, and 132B is different from the arrangement in the display device 100. In the following description, the same components as those of the display device 100 may be referred to in the description of FIG. 2 to FIG. 4.

Figure 10:
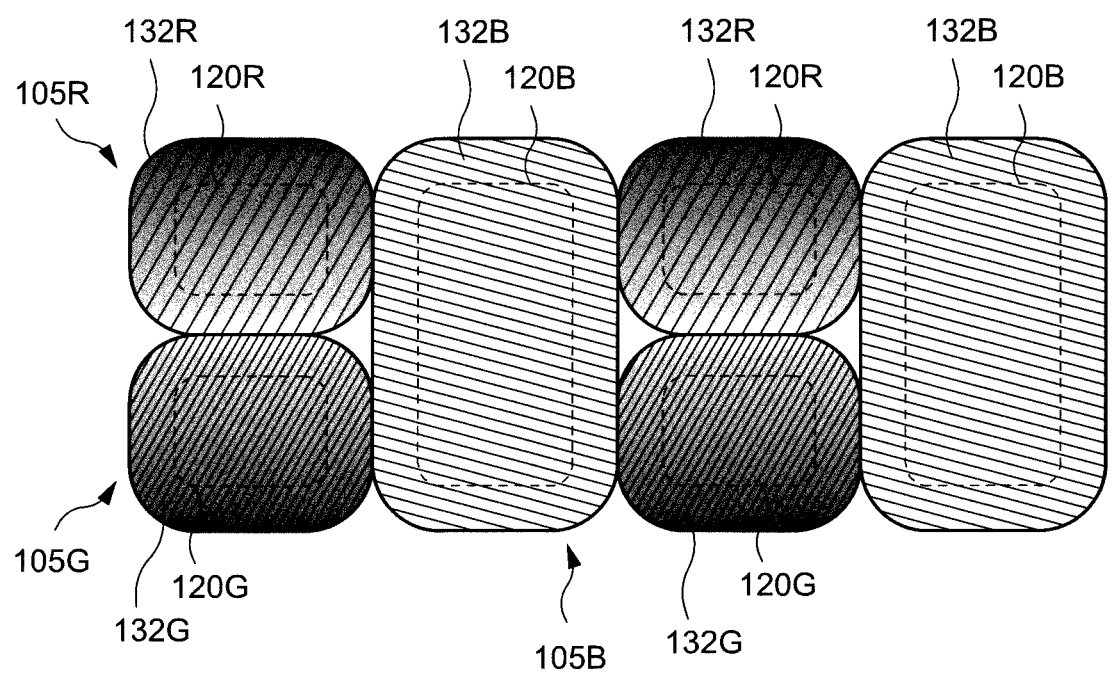
FIG. 10 is a pixel layout diagram when a display device according to an embodiment of the present invention is in a plan view.

FIG. 10 is a pixel layout diagram when the display device 100A according to an embodiment of the present invention is in a plan view. In Modification 1, the display device 100A with a square arrangement in which the light-emitting layers 132R and 132G having a smaller area than the light-emitting layer 132B are combined and arranged so as to be a rectangular shape will be described. In Modification 1, the case where the light emission start voltage of the light-emitting layer 132B is higher than the light emission start voltages of the light-emitting layer 132R and the light-emitting layer 132G will be described.

FIG. 10 shows an area where the pixels 105R, 105G, and 105B are arranged. The pixel 105R and the pixel 105B are arranged side by side in the X-direction. The pixel 105G and the pixel 105B are arranged side by side in the X-direction. The pixel 105R and the pixel 105G are arranged side by side in the Y-direction. In FIG. 10, an area indicated by a solid line is an area where the light-emitting layers 132R, 132G, and 132B are arranged. In addition, an area surrounded by a dotted line is an area where the openings 120R, 120G, and 120B are arranged in the insulating layer. Also, in the display device 100A, the stacking order of the light-emitting layers 132R, 132G, and 132B is the same as in the display device 100.

In the display device 100A, light emission at the end portions of the light-emitting layer 132R and 132G is suppressed by setting the gradient of the light emission start voltage in the area of the light-emitting layers 132R and 132G so that the light emission start voltage in the area of the light-emitting layers 132R and 132G adjacent to the end portion of the light-emitting layer 132B where unintended light emission is likely to occur is high and the light emission start voltage in the area of the light-emitting layers 132R and 132G separated from the light-emitting layer 132B is low. In the display device 100A, since the pixel 105R and the pixel 105G are arranged to be sandwiched by two pixels 105B arranged in the X-direction, the areas adjacent to the end portion of the light-emitting layer 132B exist in two opposing end portions. Therefore, it is impossible to have a structure in which the dopant concentration in the area adjacent to the end portion of the light-emitting layer 132B is decreased and the dopant concentration at the opposing end portion is increased as described in the display device 100.

In this modification, at the end portion of the light-emitting layer 132B, it is possible to reduce the strength of the leakage current in the transverse direction from the light-emitting layer 132B by decreasing the dopant concentration in the area where the light-emitting layer 312R and the light-emitting layer 132G which are close to the center of the light-emitting layer 132B, that is, the center of the opening 120B, are adjacent to, and increasing the dopant concentration in the area separated from the center of the light-emitting layer 132B opposed to that area. As a result, it is possible to suppress the occurrence of unintended light emission in the light-emitting layer 132R or the light-emitting layer 132G.

In addition, the present modification may be applied in the case where the light emission start voltage of the light-emitting layer 132R is higher than the light emission start voltages of the light-emitting layer 132G and the light-emitting layer 132B, or in the case where the light emission start voltage of the light-emitting layer 132G is higher than the light emission start voltages of the light-emitting layer 132R and the light-emitting layer 132B.

If the emission start voltage of the light-emitting layer 132R is higher than the emission start voltages of the light-emitting layer 132G and the light-emitting layer 132B, the leakage current in the transverse direction from the light-emitting layer 130R can be reduced at the end portion of the light-emitting layer 312R by decreasing the dopant concentration in the area where the light-emitting layer 132G close to the center of the light-emitting layer 132R, that is, the center of the opening 120R, is adjacent to and the area where the light-emitting layer 132B is adjacent to and increasing the dopant concentration in the area separated from the center of the light-emitting layer 132R opposed to each area. As a result, it is possible to suppress the occurrence of unintended light emission in the light-emitting layer 132G or the light-emitting layer 132B.

In addition, when the light emission start voltage of the light-emitting layer 132G is higher than the light emission start voltages of the light-emitting layer 132R and the light-emitting layer 132B, the leakage current in the transverse direction from the light-emitting element 130G can be reduced at the end portion of the light-emitting layer 132G by decreasing the dopant concentration in the area where the light-emitting layer 312R close to the center of the light-emitting layer 312G, that, is, the center of the opening 120G, is adjacent to and increasing the dopant concentration in the area separated from the center of the light-emitting layer 132G opposed to each area. As a result, it is possible to suppress the occurrence of unintended light emission in the light-emitting layer 132R or the light-emitting layer 132B.

<Modification 2>

In the present embodiment and Modification 1, an example in which a pixel electrode functions as an anode has been described. Pixel electrodes 144R, 144G, and 144B can function as cathodes as Modification 2.

Figure 11:
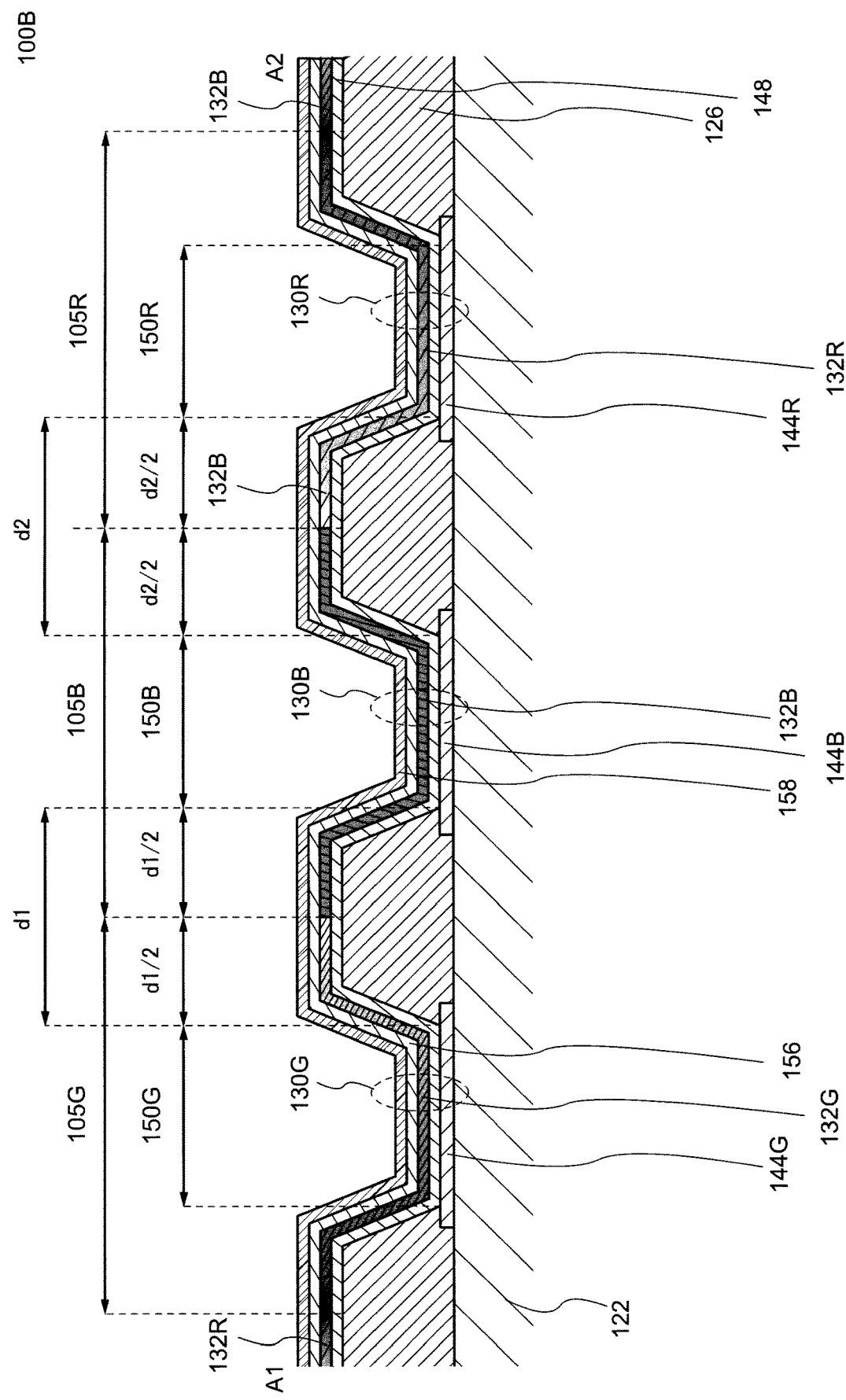
FIG. 11 is a cross-sectional view when a display device shown in FIG. 10 is cut along a line A1-A2.

FIG. 11 shows a cross-sectional view when a display device 100B is cut along a line A1-A2. The display device 100B of Modification 2 is different from the display device 100 in that the pixel electrodes 144R, 144G, and 144B function as cathodes and a counter electrode 158 functions as an anode. The common layer 148 arranged between the pixel electrodes 144R, 144G, and 144B and the light-emitting layers 132R, 132G, and 132B includes at least one of the electron transport layer and the electron injection layer. In addition, the common layer 156 arranged between the counter electrode 158 and the light-emitting layers 132R, 132G, and 132B includes at least one of the hole transport layer and the hole injection layer. Also, each of the pixel electrodes 144R, 144G, and 144B is electrically connected to the transistor 110 included in the pixel circuit.

In the display device 100B of Modification 2, the pixel electrode 144 is used as a cathode, and the counter electrode 158 is used as an anode in the light-emitting element 130. Even in this case, similar to the display device 100, the leakage current in the transverse direction or the thickness direction of the light-emitting layer 132B can be reduced by decreasing the dopant concentration in the area of the light-emitting layers 132R and 132G adjacent to the end portion of the light-emitting layer 132B where unintended light emission is likely to occur to increase the light emission start voltage in the area of the light-emitting layers 132R and 132G adjacent to the end portion of the light-emitting layer 132B. As a result, it is possible to suppress the occurrence of unintended light emission in the light-emitting layer 132R or the light-emitting layer 132G.

In addition, the configuration of the display device 100B according to Modification 2 can be applied to the configuration according to the display device 100A according to Modification 1. That is, in the display device 100A according to Modification 1, the pixel electrode 124 may be used as a cathode, and the counter electrode 138 may be used as an anode. In this case, a common layer arranged between the pixel electrode 124 and the light-emitting layer 132 includes at least one of the electron transport layer and the electron injection layer. In addition, the common layer arranged between the counter electrode 138 and the light-emitting layer includes at least the hole transport layer and the hole injection layer. The light-emitting layer having the highest light emission start voltage among the light-emitting layers 132R, 132G, and 132B is preferably arranged above the common layer 128 including the electron transport layer and the electron injection layer. The light-emitting layer is preferably composed of a light-emitting material having a hole-transport property.

As described above, the display device according to an embodiment of the present invention can be applied to various forms. Therefore, the addition, deletion, or design change of components, or the addition, deletion, or condition change of processes as appropriate by those skilled in the art based on the display devices 100, 100A to 100F described as the embodiments and modifications of the present invention are also included in the scope of the present invention as long as they are provided with the gist of the present invention. Further, each of the embodiments described above as an embodiment of the present invention can be appropriately combined and implemented as long as no contradiction is caused.

Although the above-described embodiment mainly describes the display device having the organic EL element as a display element that suppresses a leakage current in the organic layer, the present invention is applicable not only to a display device but also to an optical sensor device or the like configured by arranging an organic photodiode in which an organic layer is sandwiched between electrodes in a matrix. More specifically, the present invention can be applied to the end portion of the organic layers forming the organic photodiode, which are separately formed. Also, the present invention can be applied to a configuration in which the end portions of the organic layers forming the organic photodiode overlap.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A display device comprising:
    a first pixel electrode;
    a second pixel electrode arranged separately from the first pixel electrode in a first direction;
    an insulating layer covering the first pixel electrode and the second pixel electrode, the insulating layer including a first opening part and a second opening part, the first opening part exposing at least a part of an upper surface of the first pixel electrode, and the second opening part exposing at least a part of an upper surface of the second pixel electrode;
    a first light-emitting layer arranged at a position overlapping the first pixel electrode;
    a second light-emitting layer arranged at a position overlapping the second pixel electrode; and
    a counter electrode arranged above the first light-emitting layer and the second light-emitting layer;
    wherein a light emission start voltage of the second light-emitting layer is lower than a light emission start voltage of the first light-emitting layer,
    the second light-emitting layer includes:
        a first area arranged at a first end portion adjacent to the first light-emitting layer, the first area having a first dopant concentration; and
        a second area arranged at a second end portion of the second light-emitting layer opposing the first end portion, the second area having a second dopant concentration higher than the first dopant concentration.

2. The display device according to claim 1, wherein the second light-emitting layer includes a third area having a third dopant concentration at an area inside of the second opening part,
    the first dopant concentration is one-fifth or less of the third dopant concentration, and
    the second dopant concentration is five-fold or more of the third dopant concentration.

3. The display device according to claim 1, further comprising:
    a third pixel electrode arranged separately from the first pixel electrode in a direction opposing to the first direction; and
    a third light-emitting layer arranged at a position overlapping the third pixel electrode,
    wherein a light emission start voltage of the third light-emitting layer is lower than the light emission start voltage of the first light-emitting layer,
    the insulating layer covers the third pixel electrode, the insulating layer including a third opening part exposing at least a part of an upper surface of the third pixel electrode, and
    the third light-emitting layer includes:
        a fourth area arranged at a third end portion adjacent to the first light-emitting layer, the fourth area having a fourth dopant concentration; and
        a fifth area arranged at a fourth end portion of the third light-emitting layer opposing the third end portion, and fifth area having a fifth dopant concentration higher than the fourth dopant concentration.

4. The display device according to claim 1, wherein the third light-emitting layer includes a sixth area having a sixth dopant concentration inside of the third opening part,
    the fourth dopant concentration is one-fifth or less of the sixth dopant concentration, and
    the fifth dopant concentration is five-fold or more of the sixth dopant concentration.

5. The display device according to claim 1, wherein an emission peak wavelength of the first light-emitting layer is 460 nm or more and 500 nm or less.

6. The display device according to claim 1, wherein an emission peak wavelength of the first light-emitting layer is 610 nm or more and 780 nm or less.

7. The display device according to claim 1, wherein an emission peak wavelength of the first light-emitting layer is 500 nm or more and 570 nm or less.

* * * * *